United States Patent
Neal et al.

(10) Patent No.: US 8,343,591 B2
(45) Date of Patent: Jan. 1, 2013

(54) METHOD FOR USE WITH A COATING PROCESS

(75) Inventors: James W Neal, Ellington, CT (US); Michael J. Maloney, Marlborough, CT (US); David A. Litton, Rocky Hill, CT (US); Christopher Masucci, Coventry, CT (US)

(73) Assignee: United Technologies Corporation, Hartford, CT (US)

( * ) Notice: Subject to any disclaimer, the term of this patent is extended or adjusted under 35 U.S.C. 154(b) by 1010 days.

(21) Appl. No.: 12/257,608

(22) Filed: Oct. 24, 2008

(65) Prior Publication Data

US 2010/0104766 A1    Apr. 29, 2010

(51) Int. Cl.
| | |
|---|---|
| *B05D 3/06* | (2006.01) |
| *B05D 1/38* | (2006.01) |
| *C23C 16/02* | (2006.01) |
| *C23C 16/40* | (2006.01) |
| *C23C 16/48* | (2006.01) |
| *C23C 14/02* | (2006.01) |
| *C23C 14/08* | (2006.01) |
| *C23C 14/30* | (2006.01) |
| *C23C 14/54* | (2006.01) |

(52) U.S. Cl. ........ 427/567; 427/551; 427/557; 427/566; 427/255.32; 427/255.36; 427/255.34

(58) Field of Classification Search .................. None
See application file for complete search history.

(56) References Cited

U.S. PATENT DOCUMENTS

| | | | |
|---|---|---|---|
| 4,351,267 A | | 9/1982 | Kalbskopf |
| 4,405,659 A | | 9/1983 | Strangman |
| 4,676,994 A | * | 6/1987 | Demaray ................... 427/566 |
| 4,816,293 A | | 3/1989 | Hiramoto |
| 5,262,245 A | * | 11/1993 | Ulion et al. ................ 428/469 |
| 5,514,482 A | * | 5/1996 | Strangman ................ 428/623 |
| 5,534,314 A | | 7/1996 | Wadley |
| 5,998,003 A | * | 12/1999 | Courtright et al. ........... 428/216 |
| 6,177,200 B1 | | 1/2001 | Maloney |
| 6,255,001 B1 | | 7/2001 | Darolia |
| 6,284,323 B1 | | 9/2001 | Maloney |
| 6,365,236 B1 | * | 4/2002 | Maloney .................... 427/585 |
| 6,447,854 B1 | | 9/2002 | Rigney |
| 6,482,537 B1 | | 11/2002 | Strangman |

(Continued)

FOREIGN PATENT DOCUMENTS

EP    0969117 A2    1/2000

(Continued)

OTHER PUBLICATIONS

Extended European Search Report mailed on Mar. 3, 2010 for EP09252481.

*Primary Examiner* — Marianne L Padgett
(74) *Attorney, Agent, or Firm* — Carlson, Gaskey & Olds P.C.

(57) ABSTRACT

A method for use with a coating process includes depositing a ceramic coating on a substrate within a coating chamber. Prior to depositing the ceramic coating, an electron beam source is used to heat a ceramic material. The ceramic material radiates heat to heat a substrate to an oxidation temperature to form an oxide layer on the substrate. A desired evaporation rate of the ceramic material is established during the heating to thereby provide an improved ceramic coating.

14 Claims, 1 Drawing Sheet

U.S. PATENT DOCUMENTS

| | | | |
|---|---|---|---|
| 7,972,657 B2 * | 7/2011 | Schlichting et al. | 427/419.2 |
| 8,080,283 B2 * | 12/2011 | Schlichting et al. | 427/255.31 |
| 2003/0211245 A1 * | 11/2003 | Spitsberg et al. | 427/255.36 |
| 2004/0134430 A1 * | 7/2004 | Hass et al. | 118/723 EB |
| 2004/0211363 A1 | 10/2004 | Bruce | |
| 2005/0244663 A1 * | 11/2005 | Ulion et al. | 428/472 |
| 2005/0255242 A1 | 11/2005 | Hass | |
| 2006/0062912 A1 | 3/2006 | Wortman | |
| 2007/0172703 A1 | 7/2007 | Freling | |
| 2007/0207266 A1 | 9/2007 | Lemke | |
| 2008/0280130 A1 * | 11/2008 | Beele et al. | 428/332 |
| 2009/0308733 A1 * | 12/2009 | Maloney et al. | 204/192.12 |
| 2010/0047075 A1 * | 2/2010 | Schlichting et al. | 416/241 B |
| 2010/0047474 A1 * | 2/2010 | Neal et al. | 427/585 |
| 2010/0098865 A1 * | 4/2010 | Litton et al. | 427/318 |
| 2010/0104773 A1 * | 4/2010 | Neal et al. | 427/580 |
| 2010/0154425 A1 * | 6/2010 | Litton et al. | 60/740 |
| 2010/0189929 A1 * | 7/2010 | Neal et al. | 427/585 |
| 2010/0196605 A1 * | 8/2010 | Schlichting et al. | 427/314 |
| 2010/0247809 A1 * | 9/2010 | Neal | 427/596 |
| 2010/0247952 A1 * | 9/2010 | Latour et al. | 428/623 |
| 2010/0304037 A1 * | 12/2010 | Zimmerman et al. | 427/456 |
| 2011/0086179 A1 * | 4/2011 | Schlichting et al. | 427/454 |
| 2012/0164326 A1 * | 6/2012 | Neal | 427/248.1 |
| 2012/0196030 A1 * | 8/2012 | Neal et al. | 427/8 |

FOREIGN PATENT DOCUMENTS

| | | |
|---|---|---|
| EP | 1621647 A2 | 2/2006 |
| EP | 1801263 | 6/2007 |
| GB | 1162822 | 8/1969 |
| JP | 2006045674 | 2/2006 |
| JP | 2007192219 | 8/2007 |
| WO | WO 01/57288 A1 * | 8/2001 |
| WO | 03/028428 | 4/2003 |
| WO | 2004/011688 | 2/2004 |
| WO | 2004/048632 | 6/2004 |

* cited by examiner

METHOD FOR USE WITH A COATING PROCESS

BACKGROUND OF THE INVENTION

This disclosure relates to depositing a coating on a work piece and, more particularly, to a method for improving the coating.

Physical vapor deposition ("PVD") is one common method for coating a substrate, such as a gas turbine engine airfoil. To deposit a thermal barrier coating on a gas turbine engine airfoil, conventional Electron Beam Physical Vapor Deposition ("EB-PVD") may utilize an electron beam gun to melt and vaporize a source material in one or more crucibles within a deposition chamber and deposit the source material onto the substrate. Heaters within the deposition chamber may be used to heat the airfoils to a predetermined temperature to facilitate the coating process.

SUMMARY OF THE INVENTION

An example method for use with a coating process includes depositing a ceramic coating on a substrate within a coating chamber. Prior to depositing the ceramic coating, an electron beam source is used to heat a ceramic material within the coating chamber. The ceramic material radiates heat that heats the substrate to an oxidation temperature to form an oxide layer on the substrate. A desired evaporation rate of the ceramic material is established during the heating. For example, the initial evaporation rate is approximately zero such that the ceramic material is not prematurely deposited onto the substrate before appropriately heating the substrate.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
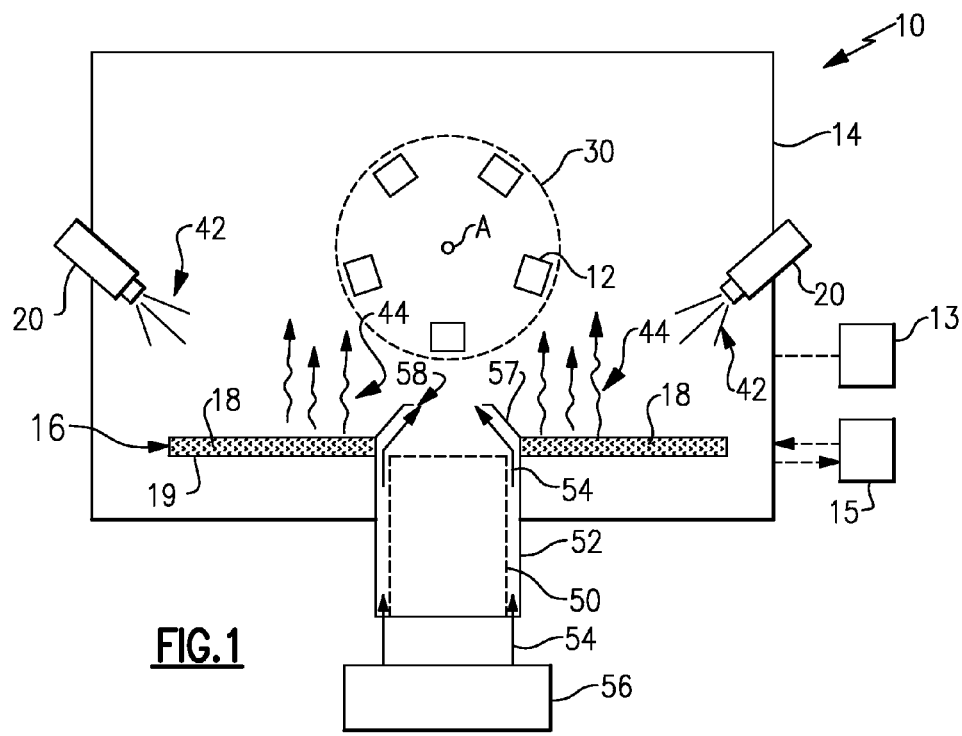
FIG. 1 illustrates selected portions of an example deposition apparatus.
Figure 2:
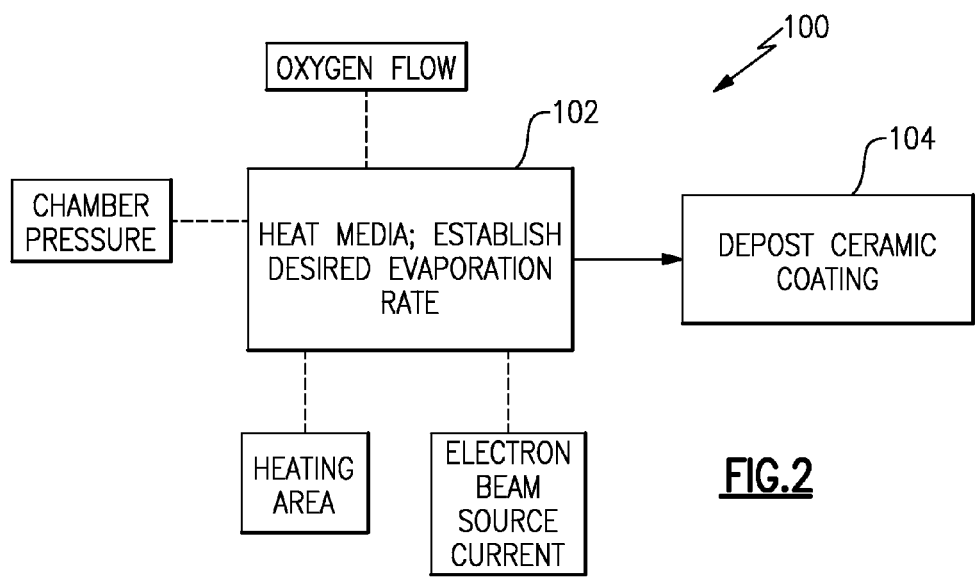
FIG. 2 illustrates an example method that may be used with the deposition apparatus of FIG. 1 for depositing a ceramic coating.

FIG. 1 illustrates selected portions of an example deposition apparatus 10 for depositing a ceramic coating on one or more work pieces 12 via physical vapor deposition ("PVD"). FIG. 2 illustrates an example method 100 that may be used with the deposition apparatus 10 for depositing the ceramic coating. For example, the deposition apparatus 10 may be used to pre-heat the work pieces 12 in preparation for depositing the ceramic coating. As will be described, the method 100 relates to the pre-heating and may be used to improve deposition of the ceramic coating.

Referring to FIG. 1, the deposition apparatus 10 is adapted for directed vapor electron beam PVD, although it is to be understood that other types of deposition equipment may also benefit from the disclosed examples. Additionally, the work pieces 12 are not limited to any particular type. For instance, the work pieces 12 may be gas turbine engine components, such as airfoils (e.g., blades and vanes), seals or other components. Additionally, the type of ceramic coating deposited may be any desired ceramic coating that is suitable for application by vapor deposition. For example, the ceramic coating may be a ceramic thermal barrier coating and may include gadolinia, zirconia, yttria, combinations thereof, or other materials. In one example, the ceramic thermal barrier coating includes gadolinia stabilized zirconia. In a further example, the ceramic thermal barrier coating includes about 59 wt % of gadolinia and a balance of zirconia. The term "about" as used in this description relative to compositions or other values refers to possible variation in the given value, such as normally accepted variations or tolerances in the art.

In the illustrated example, the deposition apparatus 10 includes a coating chamber 14 for containing the work pieces 12 during the coating process. For instance, the coating chamber 14 may be a vacuum chamber and may include various ports for evacuating the interior of the coating chamber 14 or for selectively introducing gases that are to be used in the coating process. For instance, a gas source 13 provides a desired flow of oxygen or other gas. Optionally, a pump 15 may circulate a coolant (e.g., water) through walls of the coating chamber 14 to control the temperature of the walls of the coating chamber 14.

A heating source 16 may be located within the coating chamber 14 to heat the work pieces 12 to an oxidation temperature for the pre-heating stage. For instance, the work pieces 12 may include a nickel alloy substrate and a bond coat on the substrate. The bond coat may include MCrAlY, where the M includes at least one of nickel, cobalt, iron, or a combination thereof, Cr is chromium, Al is aluminum, and Y is yttrium.

The work pieces 12 may be pre-heated at the oxidation temperature to form a thermally grown oxide on the bond coat that enhances adhesion of ceramic thermal barrier coatings to the work pieces 12. In one example, the oxidation temperature is about 1700-2100° F. (927-1149° C.). For instance, the temperature may be greater than 1825° F. (996° C.) to form alpha alumina oxide but less than the temperature tolerance of the alloy used for the work piece 12 (e.g., 2100° F.). The work pieces 12 may be heated as described in co-pending U.S. Ser. No. 12/196,368 entitled "DEPOSITION APPARATUS HAVING THERMAL HOOD." Given this description, one of ordinary skill in the art will recognize suitable oxidation temperatures to meet their particular needs.

In the disclosed example, the heating source 16 includes a media 18 that may be used to radiate heat and heat the work pieces 12 to the oxidation temperature. The media 18 may be any type of media that radiates heat. For instance, the media 18 may include particles of a ceramic material in a water-cooled tray 19. In one example, the ceramic material composition is equivalent to the composition of the ceramic thermal barrier coating that is to be deposited onto the work pieces 12 to avoid contaminating the work pieces 12 with foreign substances. In a further example, the media 18 includes gadolinia and zirconia.

At least one electron beam source 20, such as an axial electron gun, is mounted relative to the coating chamber 14 for pre-heating the media 18 and for depositing the ceramic thermal barrier coating. The disclosed example illustrates two electron beam sources 20, which may be used for pre-heating the media 18, applying the ceramic thermal barrier coating, or both. However, given this description, one of ordinary skill in the art will recognize that a single source or additional sources may be used to meet the needs of a particular application or coating process.

The work pieces 12 are mounted within a coating zone 30 within the coating chamber 14. For instance, the coating zone 30 is the spatial volume where the work pieces 12 will be coated. The work pieces 12 may be mounted in the coating zone 30 using a mounting fixture, such as a cylindrical fixture that extends around axis A.

The electron beam sources 20 may be activated to emit electron beams 42 onto the media 18. The electron beams 42 heat the media 18 and produce radiant heat 44 that radiates toward the coating zone 30. For example, a controller (not shown) may utilize software, hardware, or both to control focus, filament current, scanning area (power density), and/or other parameters of the electron beam sources 20 along with other operations associated with the deposition apparatus 10 (e.g., gas flow) to provide a desired amount of heat before and/or during the coating process. The electron beam sources 20 may also raster relatively low current-density electron beams 42 across the work pieces 12 prior to or during coating to directly heat the work pieces 12.

In the coating process, an ingot 50 is the source material for coating the work pieces 12. The deposition apparatus 10 introduces the ingot 50 into the coating chamber 14 through a crucible 52. Although only one crucible 52 is shown, the coating chamber 14 may utilize multiple crucibles 52 and ingots 50. A nozzle 57 on the crucible 52 includes an orifice 58 for directing a carrier gas 54 from a pressurized gas source 56 in a desired direction toward the work pieces 12 (e.g., directed vapor deposition). The nozzle 57 tapers from the sides of the crucible 52 to the orifice 58 to "jet" the carrier gas 54 toward the work pieces 12.

The electron beams 42 heat and evaporate the ingot 50. The carrier gas 54 directed from the orifice 58 carries the evaporated ingot material toward the work pieces 12. The evaporated ingot material deposits onto the surfaces of the work pieces 12 as the ceramic thermal barrier coating.

Referring to FIG. 2 the example method 100 may be used with the deposition apparatus 10 for depositing the ceramic thermal barrier coating on the work pieces 12. However, it is to be understood that the method 100 may also be used with other physical vapor deposition devices and is not limited to the example apparatus 10. In this example, the method 100 includes a pre-heating step 102 of heating the media 18 and establishing a desired evaporation rate of the media 18, and a coating step 104 that includes depositing the ceramic thermal barrier coating on the work pieces 12 from the ingot 50.

In the pre-heating step 102, establishing the desired evaporation rate of the media 18 may be used to limit or prevent unwanted evaporation of the media 18. For instance, if the media includes gadolinia and zirconia (e.g., gadolinia stabilized zirconia), the gadolinia melts at a lower temperature than the zirconia. Therefore, heating the media 18 may cause melting and evaporation of small amounts of the gadolinia prior to completing the pre-heating to form the thermally grown oxide on the work pieces 12. If the gadolinia evaporates, the evaporated gadolinia may condense on the work pieces 12. In some examples, deposition of gadolinia during the pre-heating step may be desired. However, in other examples, evaporation and deposition of gadolinia during the pre-heating step 102 is unwanted because the deposited gadolinia may alter the stoichiometry of the subsequently deposited ceramic thermal barrier coating or lead to other unforeseen or unwanted results. In this regard, the method 100 may be used to establish the desired evaporation rate of the media 18 at about zero to avoid deposition of gadolinia during the pre-heating step 102.

The heating of the media 18 may be controlled to establish a desired evaporation rate of the media 18, such as to avoid evaporation of the media 18. In one example, a nominal gas flow rate through the coating chamber 14 may be used to attenuate the electron beams 42 and control evaporation of the media 18 (e.g., gadolinia). The term "nominal" as used in this description may refer to the actual flow rate, measured flow rate, set point flow rate, or other indication of the flow rate.

For instance, the gas source 13 may control an oxygen flow rate through the coating chamber 14. Oxygen gas is used during the pre-heating step 102 to facilitate forming the thermally grown oxide on the bond coat. The oxygen gas may be mixed with an inert gas, such as argon. In one example, the gas source 13 establishes a nominal oxygen gas flow rate through the coating chamber 14 of about 100-600 standard cubic centimeters per minute to attenuate the electron beams 42 and establish an evaporation rate of about zero. In a further example, the gas source 13 establishes a nominal oxygen gas flow rate of about 500-600 standard cubic centimeters per minute to attenuate the electron beams 42 and establish an evaporation rate of about zero. Higher gas flow rates may be used when coating the work pieces 12, after pre-heating. For instance, mixed gas flow of oxygen with argon, helium, and/or hydrogen may be about 10,000 standard cubic centimeters or more, depending on the parameters of a particular coating process.

In another aspect, the gas flow rate during pre-heating may correspond to a gas pressure within the coating chamber 14. For instance, the gas pressure may be about $1 \times 10^{-4}$-$2 \times 10^{-3}$ torr (0.013-0.267 pascals). In a further example, the gas pressure may be about $7 \times 10^{-4}$-$1 \times 10^{-3}$ torr (0.093-0.133 pascals). Higher pressures may be used when coating the work pieces 12, after pre-heating. For instance, the gas pressure may be about $5 \times 10^{-2}$-$5 \times 10^{-1}$ torr (6.7-66.7 pascals).

Alternatively, or in addition to controlling the gas flow rate, the electron beam sources 20 may be programmed to scan and heat only a desired area of the media 18 to establish a desired evaporation rate of the media 18, such as to avoid evaporation of the media 18. For example, if the media 18 is crushed particles of gadolinia stabilized zirconia in the water-cooled tray 19, the electron beam sources 20 may heat an area of about 50-200 square inches (323-1290 square centimeters) to establish an evaporation rate of about zero. In another example, the area is about 87-175 square inches (561-1129 square centimeters) to establish an evaporation rate of about zero. Using the given areas provides the benefit of distributing the electron beams 42 over a relatively large area that avoids rapid heating of the media 18.

Alternatively, or in addition to controlling the gas flow rate and the heating area, a filament electric current of the electron beam sources 20 may be controlled to establish a desired evaporation rate of the media 18, such as to avoid evaporation of the media 18. For instance, the filament electric current corresponds to a power density of the electron beams 42. If the power density exceeds a certain threshold, the media 18 may evaporate. In one example, limiting the filament electric current to about 1-3.5 amperes establishes an evaporation rate of the media 18 of about zero. In a further example, the filament electric current is about 1.5-2.75 amperes. In a further example, the filament electric current is about 2.125 amperes. It is to be understood however, that the filament electric current may depend upon the type of electron beam gun used. In one example, the electron beam gun is a linear type gun rated at about 70 kW at 70 kV functioning at about 1 ampere, which is suitable for the relatively high pressures used in directed vapor electron beam PVD.

As indicated, the gas flow, heating area, and filament electric current may be controlled in combination to establish a desired evaporation rate of the media 18, such as to avoid evaporation of the media 18. Thus, any of the given parameters may be used in combination with other given parameters, such as beam spot specific power and raster frequency, to achieve a desired evaporation rate.

After the pre-heating step 102, the deposition apparatus 10 deposits the ceramic thermal barrier coating on the work pieces 12 during the coating step 104. For example, the deposition apparatus 10 evaporates the ingot 50 as described above. In one example, the parameters selected for the pre-heating step 102 may be adjusted prior to the coating step 104 to facilitate depositing the ceramic thermal barrier coating. For instance, the gas source 13 may change the gas flow such that the electron beams 42 may be focused on the ingot 50 with less attenuation. The oxygen gas facilitates formation of the thermally grown oxide, while the coating step 104 does not require as much oxygen. The filament electric current may also be adjusted for the coating step 104.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A method for use with a coating process, comprising:
   heating particles of a ceramic material in a water-cooled tray within a coating chamber by scanning electron beams from an electron beam source over the particles of the ceramic material and not over an ingot of a source coating material such that the particles of ceramic material radiantly heat a substrate having a bond coat that includes aluminum, to an oxidation temperature to form an alumina layer from the bond coat on the sustrate;
   controlling the heating by establishing a nominal oxygen gas flow rate through the coating chamber of about 100-600 standard cubic centimeters per minute to attenuate the electron beams emitted from the electron beam source to establish a desired evaporation rate of the particles of ceramic material;
   after forming the alumina layer, reducing the nominal oxygen gas flow rate and then depositing a ceramic coating on the alumina layer within the coating chamber by evaporating the ingot of a source coating material.

2. The method as recited in claim 1, wherein the ceramic material includes gadolinia and zirconia.

3. The method as recited in claim 1, including establishing the desired evaporation rate to be about zero.

4. The method as recited in claim 1, further comprising establishing the nominal oxygen gas flow rate to be about 500-600 standard cubic centimeters per minute.

5. The method as recited in claim 1, including controlling the heating by establishing a gas pressure within the coating chamber that is about $1 \times 10^{-4}$–$2 \times 10^{-3}$ torr (0.013-0.267 pascals).

6. The method as recited in claim 1, including controlling the heating by establishing a gas pressure within the coating chamber of about $7 \times 10^{-4}$–$1 \times 10^{-3}$ torr (0.093-0.133 pascals).

7. The method as recited in claim 1, including establishing the oxidation temperature within the coating chamber to be about 1700-1960° F. (927-1071° C.).

8. The method as recited in claim 1, including heating an area of about 50-200 square inches (323-1290 square centimeters) of the ceramic material to establish the desired evaporation rate.

9. The method as recited in claim 8, including establishing the area to be about 87-175 square inches (561-1129 square centimeters).

10. The method as recited in claim 1, including selecting the ceramic coating to include gadolinia stabilized zirconia.

11. The method as recited in claim 10, further comprising selecting the ceramic coating to include yttria stabilized zirconia.

12. The method as recited in claim 1, including selecting the ceramic coating to include about 59 wt % gadolinia and a balance of zirconia.

13. The method as recited in claim 1, wherein the ingot is within a crucible having a tapered nozzle.

14. The method as recited in claim 1, including jetting the evaporated source coating material from a tapered nozzle toward the substrate to deposit the ceramic coating on the alumina layer.

* * * * *